United States Patent
Feldmann et al.

(10) Patent No.: US 10,511,258 B2
(45) Date of Patent: Dec. 17, 2019

(54) PHOTOVOLTAIC ASSEMBLY HAVING CORNER-FACING ELECTRICAL CONNECTOR PORT

(71) Applicant: SunPower Corporation, San Jose, CA (US)

(72) Inventors: Kyle Donald Feldmann, Richmond, CA (US); Lee Gorny, Mountain View, CA (US); Matthew Deschambeault, Oakland, CA (US); Gary Alan Rossi, Pleasant Hill, CA (US); John Paul Kapla, Mill Valley, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 15/624,219

(22) Filed: Jun. 15, 2017

(65) Prior Publication Data

US 2017/0366136 A1 Dec. 21, 2017

Related U.S. Application Data

(60) Provisional application No. 62/351,539, filed on Jun. 17, 2016.

(51) Int. Cl.
| | | |
|---|---|---|
| *H02S 40/36* | (2014.01) | |
| *H02S 40/30* | (2014.01) | |
| *H02S 30/10* | (2014.01) | |
| *H02S 40/32* | (2014.01) | |
| *H02S 40/34* | (2014.01) | |
| *H01L 31/048* | (2014.01) | |
| *H01R 24/30* | (2011.01) | |

(Continued)

(52) U.S. Cl.
CPC ............ *H02S 40/36* (2014.12); *H01L 31/048* (2013.01); *H01R 24/30* (2013.01); *H01R 24/78* (2013.01); *H02S 30/10* (2014.12); *H02S 40/30* (2014.12); *H02S 40/32* (2014.12); *H02S 40/34* (2014.12); *H01R 2103/00* (2013.01)

(58) Field of Classification Search
CPC .......... H02S 30/10; H02S 40/30; H02S 40/32; H02S 40/34; H02S 40/36; H01L 31/048
See application file for complete search history.

(56) References Cited

U.S. PATENT DOCUMENTS

| 8,455,752 B2 | 6/2013 | Korman et al. |
|---|---|---|
| 9,057,540 B2 | 6/2015 | Buettner et al. |

(Continued)

FOREIGN PATENT DOCUMENTS

WO   WO 2015/130990   9/2015

OTHER PUBLICATIONS

Supplementary European Search Report from PCT/US2017/038046 dated May 13, 2019, 8 pgs.

*Primary Examiner* — Lindsey A Bernier
(74) *Attorney, Agent, or Firm* — Schwabe, Williamson & Wyatt, P.C.

(57) ABSTRACT

Photovoltaic (PV) assemblies and electrical connections for interconnecting PV modules to form PV arrays are described herein. The PV assemblies can include angled connector terminals to electrically mate with power connector ports of the PV modules. A power connector port can face a corner of a PV module. The electrical connections of the PV assemblies can simplify cable management and facilitate flexibility in arrangement and interconnection of PV modules and PV arrays.

21 Claims, 18 Drawing Sheets

(51) Int. Cl.
*H01R 24/78* (2011.01)
*H01R 103/00* (2006.01)

(56) References Cited

U.S. PATENT DOCUMENTS

| | | | |
|---|---|---|---|
| 2002/0078991 A1* | 6/2002 | Nagao | H01L 31/02008 |
| | | | 136/251 |
| 2012/0174958 A1* | 7/2012 | Park | H01L 31/0201 |
| | | | 136/244 |
| 2014/0238489 A1 | 8/2014 | Buettner et al. | |
| 2017/0133982 A1* | 5/2017 | Weinshenker | H02S 40/36 |
| 2017/0187328 A1 | 6/2017 | Miljkovic et al. | |

* cited by examiner

PHOTOVOLTAIC ASSEMBLY HAVING CORNER-FACING ELECTRICAL CONNECTOR PORT

This application claims the benefit of U.S. Provisional Patent Application No. 62/351,539, filed Jun. 17, 2016, and this application hereby incorporates herein by reference that provisional patent application.

BACKGROUND

Typical photovoltaic (PV) modules may generate direct current (DC) power based on received solar energy. PV modules may include several solar or PV cells electrically coupled to one another allowing the PV cells to contribute to a combined output power for a PV module. A typical PV module generally includes a rectangular frame surrounding a PV laminate encapsulating solar cells, and a junction box. The junction box encapsulates electrical connections protruding from a backsheet of the PV laminate which are in electrical connection with the solar cells of the PV module.

In particular applications, the DC power generated by a photovoltaic module may be converted to AC power through the use of a power inverter. The power inverter may be electrically coupled to an output of the PV module. Typically, intervening wiring (e.g., DC-4 connectors) may be used between the PV module, junction box and the power inverter. The power inverter may be electrically coupled to the DC output of the PV module (e.g., the PV cables). The power inverter may be located physically apart from the PV module, with only the intervening wiring and associated hardware physically coupling the PV module to the power inverter.

BRIEF DESCRIPTION OF THE DRAWINGS

The following drawings illustrate by way of example and not limitation. For the sake of brevity and clarity, every feature of a given structure is not always labeled in every figure in which that structure appears. Identical reference numbers do not necessarily indicate an identical structure. Rather, the same reference number may be used to indicate a similar feature or a feature with similar functionality, as may non-identical reference numbers. The figures are not drawn to scale.

DETAILED DESCRIPTION

Figure 1:
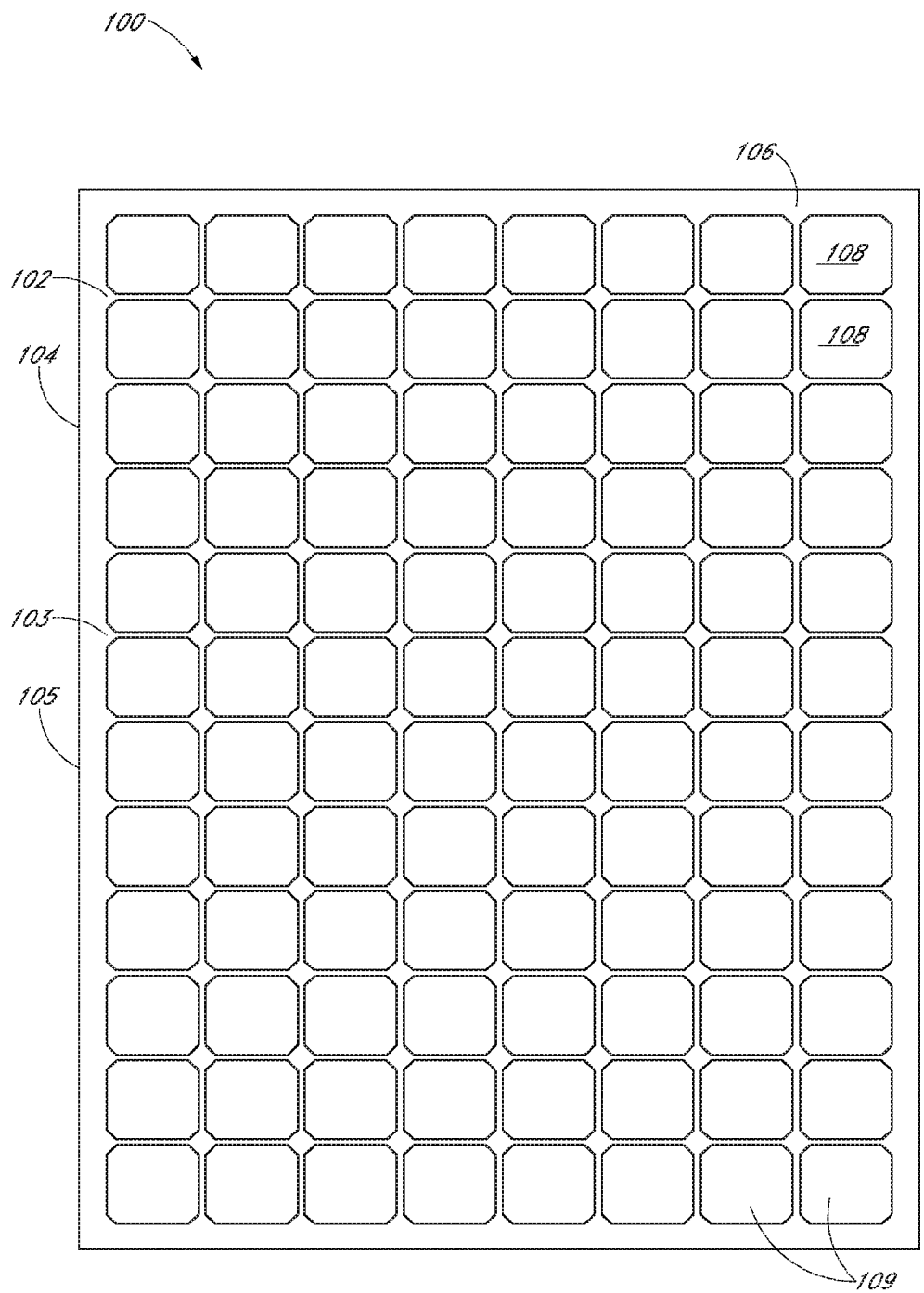
FIG. 1 depicts a front side of a photovoltaic module, in accordance with an embodiment of the present disclosure.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

Certain terminology may be used in the following description for the purpose of reference only, and thus are not intended to be limiting. For example, terms such as "upper", "lower", "above", and "below" refer to directions in the drawings to which reference is made. Terms such as "front", "back", "rear", "side", "axial", and "lateral" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import. Similarly, the terms "first", "second", and other such numerical terms referring to structures do not imply a sequence or order unless clearly indicated by the context.

Terminology—The following paragraphs provide definitions and/or context for terms found in this disclosure (including the appended claims):

This specification includes references to "one embodiment" or "an embodiment." The appearances of the phrases "in one embodiment" or "in an embodiment" do not necessarily refer to the same embodiment. Particular features, structures, or characteristics can be combined in any suitable manner consistent with this disclosure.

This term "comprising" is open-ended. As used in the appended claims, this term does not foreclose additional structure or steps.

Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

As used herein, the terms "first," "second," etc. are used as labels for nouns that they precede, and do not imply any type of ordering (e.g., spatial, temporal, logical, etc.). For example, reference to a "first" encapsulant layer does not necessarily imply that this encapsulant layer is the first encapsulant layer in a sequence; instead the term "first" is used to differentiate this encapsulant from another encapsulant (e.g., a "second" encapsulant).

The terms "a" and "an" are defined as one or more unless this disclosure explicitly requires otherwise.

The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

As used herein, "inhibit" is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

As used herein, the term "substantially" is defined as largely but not necessarily wholly what is specified (and includes what is specified; e.g., substantially 90 degrees includes 90 degrees and substantially parallel includes parallel), as understood by a person of ordinary skill in the art. In any disclosed embodiment, the terms "substantially," "approximately," and "about" may be substituted with "within [a percentage] of" what is specified, where the percentage includes 0.1, 1, 5, and 10 percent.

As used herein, "regions" can be used to describe discrete areas, volumes, divisions or locations of an object or material having definable characteristics but not always fixed boundaries.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present invention. The feature or features of one embodiment can be applied to other embodiments, even though not described or illustrated, unless expressly prohibited by this disclosure or the nature of the embodiments.

Photovoltaic (PV) assemblies and modules for converting solar radiation to electrical energy are disclosed herein. PV arrays having several PV modules are also described herein. A PV assembly can have at least one PV module having a front side and a back side opposite the front side. A PV module can have several solar cells encapsulated within a PV laminate. In some embodiments, a PV module includes a frame at least partially surrounding the PV laminate. In such embodiments, the frame can have at least one feedthrough opening at a first corner of the PV laminate and/or frame. In an embodiment, the PV module has an electronic component for conditioning power generated by the several solar cells. In some embodiments, the PV module is an alternating current photovoltaic (ACPV) module, and the electronic component has a power inverter or DC-AC inverter, commonly referred to as a "microinverter," for converting direct current (DC) to alternating current (AC). The electronic component may include an electronic DC-to-DC optimizer. The electronic component can be coupled to the back side of the PV laminate at, near or towards the first corner of the PV laminate and/or the frame (if present). The electronic component can have a DC connector port electrically coupled to the several solar cells. The electronic component can further have a conditioned power connector port facing a vertex of the first corner of the PV laminate and/or frame (if present). In embodiments with a frame having a corner feedthrough opening, the conditioned power connector port can face the at least one feedthrough opening such that an electrical connector can extend therethrough.

Electrical connectors, electrical routing structures and related PV assemblies for interconnecting several PV modules to form PV arrays are also described herein. In an embodiment, a PV array or assembly can have electrical connectors or cables for connection to an external load (e.g., an external grid, a site transition box, a site combiner box, site electrical service panel, a combination thereof, etc.). A PV array or assembly can further have module-to-module interconnecting cables, or "jumper" cables or connectors, for interconnecting PV modules of a PV array. The electrical connectors or cables can have a first end, a second end and a conductor body therebetween. The first end has a first angled connector terminal and the second end has a second angled connector terminal. The first angled connector terminal can be configured to be electrically mated with a conditioned power connector port of a first PV module and the second angled connector terminal can be configured to be electrically mated with a conditioned power connector port of a second PV module.

Cable installation and management for PV assemblies and arrays can be challenging due to awkward cable lengths, connector port positioning, connector shapes, module configurations and/or array arrangement for a particular site. Installation of PV assemblies and arrays can be challenging as wires and cables must often be managed in locations with limited accessibility (e.g., at the back side of modules) to minimize environmental degradation, improve aesthetics and/or meet installation regulations. Other cable management approaches include the use of clips for clipping cables to the frame, mounting rails or combination thereof. Additionally, modules are often optimized for installation in a particular configuration (e.g., "portrait" or "landscape") which presents challenges in terms of flexibility in arrangement of the array and ease of installation. The PV assemblies and electrical connections described herein simplify cable management and facilitate flexibility in arrangement and interconnection of PV modules and arrays.

Although many of the examples described herein are ACPV modules, the techniques and structures apply equally to other (e.g., DC) PV modules as well.

FIG. 1 illustrates a top-down view of a module 100 having a front side 102 that faces the sun during normal operation and a back side 104 opposite the front side 102. The module 100 has a laminate 106 encapsulating several solar cells 108. In some embodiments, the module 100 can be 'frameless' such as depicted in FIG. 1. The solar cells 108 can face the front side 102 and be arranged into several solar cell strings 109. Each solar cell string 109 can be a column (or row) of solar cells 108 electrically connected in series. The solar cell strings 109 may also be electrically connected to each other in series or in parallel. The laminate 106 can include one or more encapsulating layers which surround and enclose the solar cells 108. In various embodiments, the laminate 106 has a top cover 103 made of glass or another transparent material on the front side 102. In certain embodiments, the material chosen for construction of the cover 103 can be selected for properties which minimize reflection, thereby permitting the maximum amount of sunlight to reach the solar cells 108. The top cover 103 can provide structural rigidity to the laminate 106. The laminate 106 can further have a backsheet 105 on the back side 104. The backsheet 105 can be a weatherproof and electrically insulating layer which protects the underside of the laminate 106. The backsheet 105 can be a polymer sheet, and it can be laminated to encapsulant layer(s) of the laminate 106, or it can be integral with one of the layers of the encapsulant.

Figure 2:
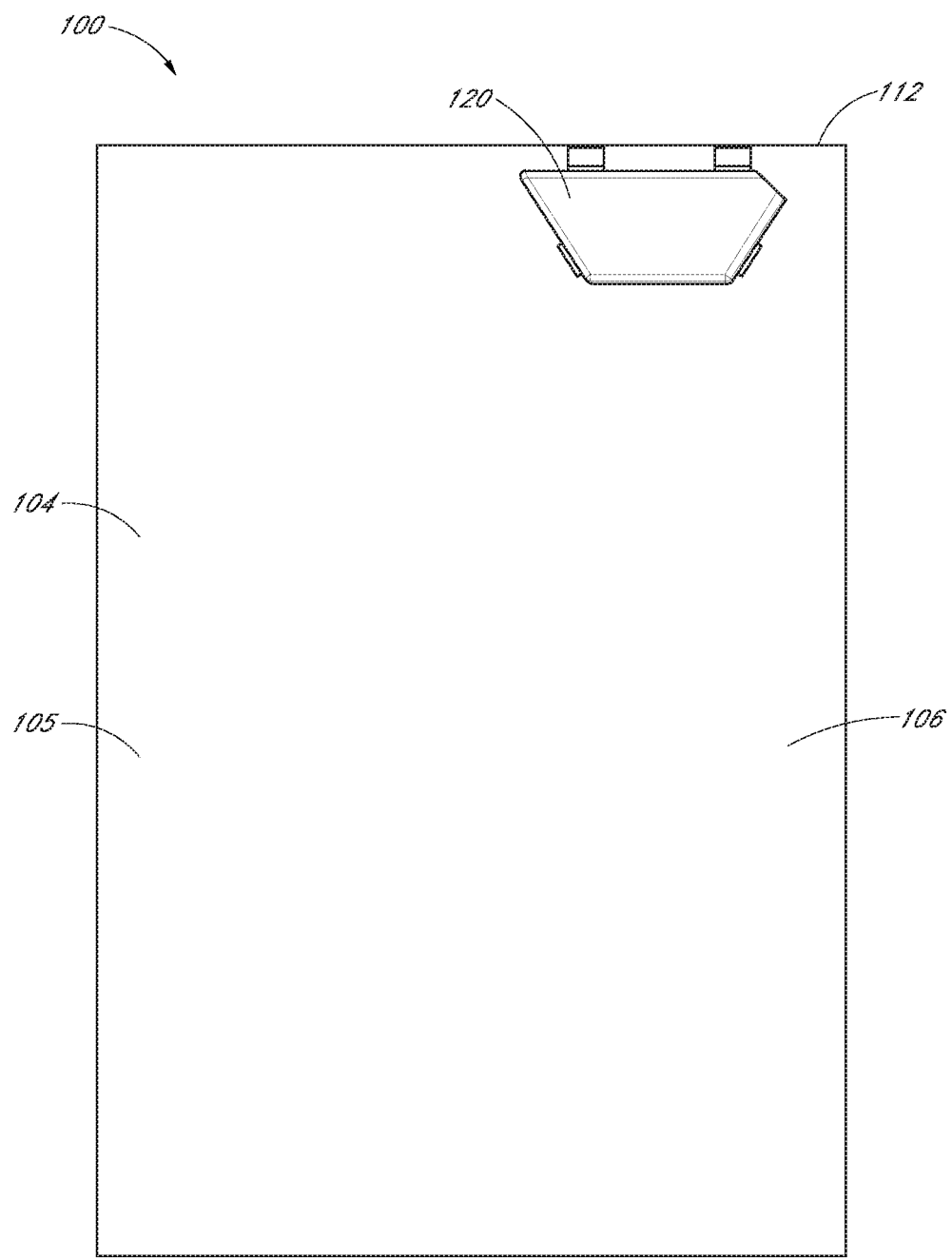
FIG. 2 depicts a back side of a photovoltaic module, in accordance with an embodiment of the present disclosure.

FIG. 2 depicts a view of the back side 104 of module 100 having an electronic component 120 for conditioning power generated by the several solar cells 108. The electronic component 120 is coupled to the back side 104 of the laminate 106. In particular, the electronic component 120 is coupled to the backsheet 105 towards a first corner 112 of the laminate 106. Corner 112 can be a location where edges of back side 104 meet. For example, edges defining back side 104 may extend orthogonal to each other at corner 112. In an embodiment, the electronic component 120 is coupled to the laminate 106 via an adhesive or other securing device or feature (e.g., clip, hook, etc.). In some embodiments, the electronic component 120 has an inverter or "microinverter" for converting DC generated by solar cells 108 into AC. When electrical component 120 generates AC, module 100 can be considered an ACPV module.

In an embodiment, the module 100 can have busbars or conductor ribbons (not pictured) which are electrically coupled to the several solar cells 108 and can be encapsulated within the laminate 106. The busbars or conductor ribbons can penetrate the backsheet 105 of the laminate 106 to make an electrical connection to the electronic component 120. In one embodiment, the electronic component can have a DC connector port or opening through which the busbars or conductor ribbons can connect or pass through, thereby electrically coupling the solar cells 108 to the electronic component 120 directly. For example, a DC connector port or opening (not visible in FIG. 2) of the electronic component 120 can be configured to face the backsheet 105 at or near a location that busbars or conductor ribbons penetrate the backsheet 105 of the laminate 106. The busbars or conductor ribbons can be in electrical contact with the solar cells 108.

In other embodiments, the module 100 has a junction box (not pictured) for providing electrical access to the several solar cells 108 encapsulated within the laminate 106. The junction box can include bypass diodes for providing alternate current pathways through the module 100 should one of the solar cells 108 and/or solar cell strings 109 of the module 100 become damaged, shaded, or otherwise inoperable. In one embodiment, a junction box can have a DC output connector port for outputting DC generated by the several solar cells 108 to a DC connector port (or DC input connector port) of the electronic component 120. In some embodiments, the electronic component 120 is configured to be removably coupled to the junction box (if present).

Figure 3:
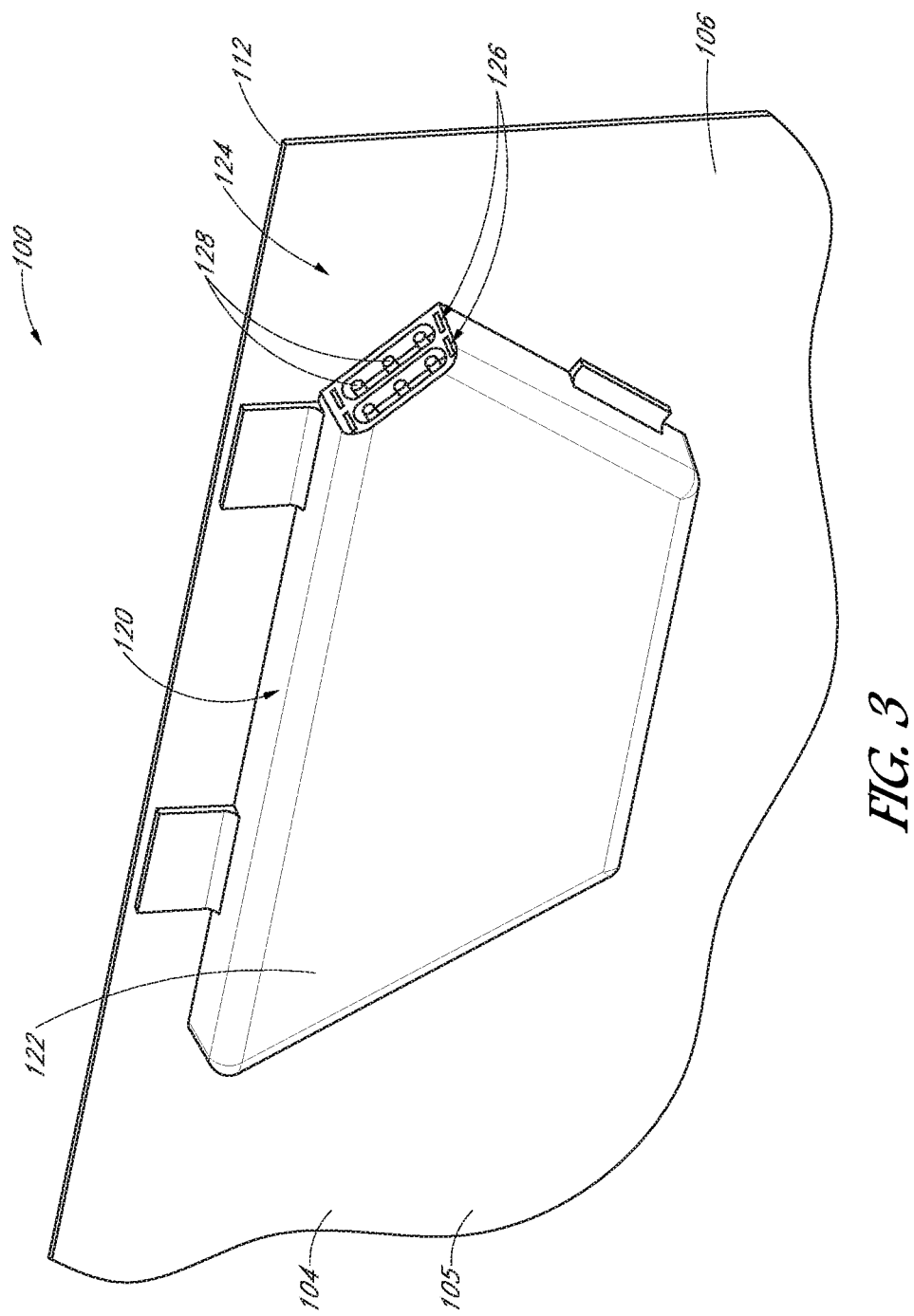
FIG. 3 depicts a magnified view of a back side corner portion of a photovoltaic module, in accordance with an embodiment of the present disclosure.

FIG. 3 depicts a magnified view of the back side 104 of a corner portion of module 100 having electronic component 120. The electronic component 120 has a housing or enclosure 122. The housing 122 can have a bottom surface configured to confront or mount on the back side 104 of module 100. The electronic component housing 122 can be integrally formed or be formed from an assembly of parts. In an embodiment, the electronic component housing 122 is composed of a metallic material such as aluminum. In another embodiment, the electronic component housing 122 is composed of a heat dissipating polymer. The electronic component housing 122 can seal interior electrical components and circuitry from moisture, dust and other contaminants, and also dissipate any generated heat.

In an embodiment, the electronic component 120 has a conditioned power connector port 124 facing the vertex of the first corner 112 of the laminate 106. In embodiments where the module 100 is an ACPV module, the conditioned power connector port 124 can be an AC connector port. In some embodiments, the conditioned power connector port 124 of the electronic component 120 has several stacked plugs 126. The term "stacked" can refer to plugs 126 being arranged relative to each other in a vertical direction. For example, a first plug 126 may be at a first vertical height below laminate 106, and a second plug 126 may be at a second vertical height greater than the first vertical height relative to the laminate 106. Furthermore, the plugs 126 may be laterally aligned, e.g., a vertical axis may pass through both plugs. In the exemplary embodiment depicted in FIG. 3, two stacked plugs 126 are provided, however any desired number of plugs can be provided. For example, in some embodiments, a single plug facing the first corner 112 can be provided. In other embodiments, three or more stacked plugs can face the first corner 112. Each plug 126 may include one or more pins 128. Pins 128 can include respective pin axes directed outward toward first corner 112. For example, each pin axis may extend through a feedthrough opening in a frame of a PV module assembly, as described below. In an embodiment, plug 124 include a plug face on at outer surface of electronic component 120. The plug face may be orthogonal to the respective axes of each pin 128. Furthermore the plug face may face corner 112.

In the embodiment depicted in FIG. 3, the conditioned power connector port 124 is angled (e.g., 45° from one or more of the edges meeting at the vertex of the laminate 106) so as to face the vertex of the first corner 112 of the laminate 106. In other embodiments, a face of the conditioned power connector port 124 can be parallel to an edge of the laminate. In yet other embodiments, the face of the conditioned power connector port 124 can be angled greater or less than 45° from an edge of the laminate 106 or from the plane of the laminate 106.

In an embodiment, the conditioned power connector port 124 outputs conditioned power (e.g., AC power of an ACPV module) to an external load. The conditioned power connector port 124 can be connected to other PV modules to form a PV array. In the embodiment depicted in FIG. 3, each plug 126 has several pins 128. The pins 128 of the conditioned power connector port 124 can be provided as three conductors (e.g., line 1, line 2, and ground for transmitting AC power). However other suitable arrangements with one or more pins can be provided. For example, four pins 128 (e.g., line 1, line 2, neutral, and ground) can be provided. As yet another example, two pins can be provided as two conductors (a plus and a minus) to conduct DC current.

FIGS. 1-3 illustrate PV modules and assemblies according to one embodiment. Unless otherwise designated, the components of FIGS. 4-6 are similar, except that corresponding numerals in FIGS. 4-6 are incremented sequentially by 100.

Figure 4:
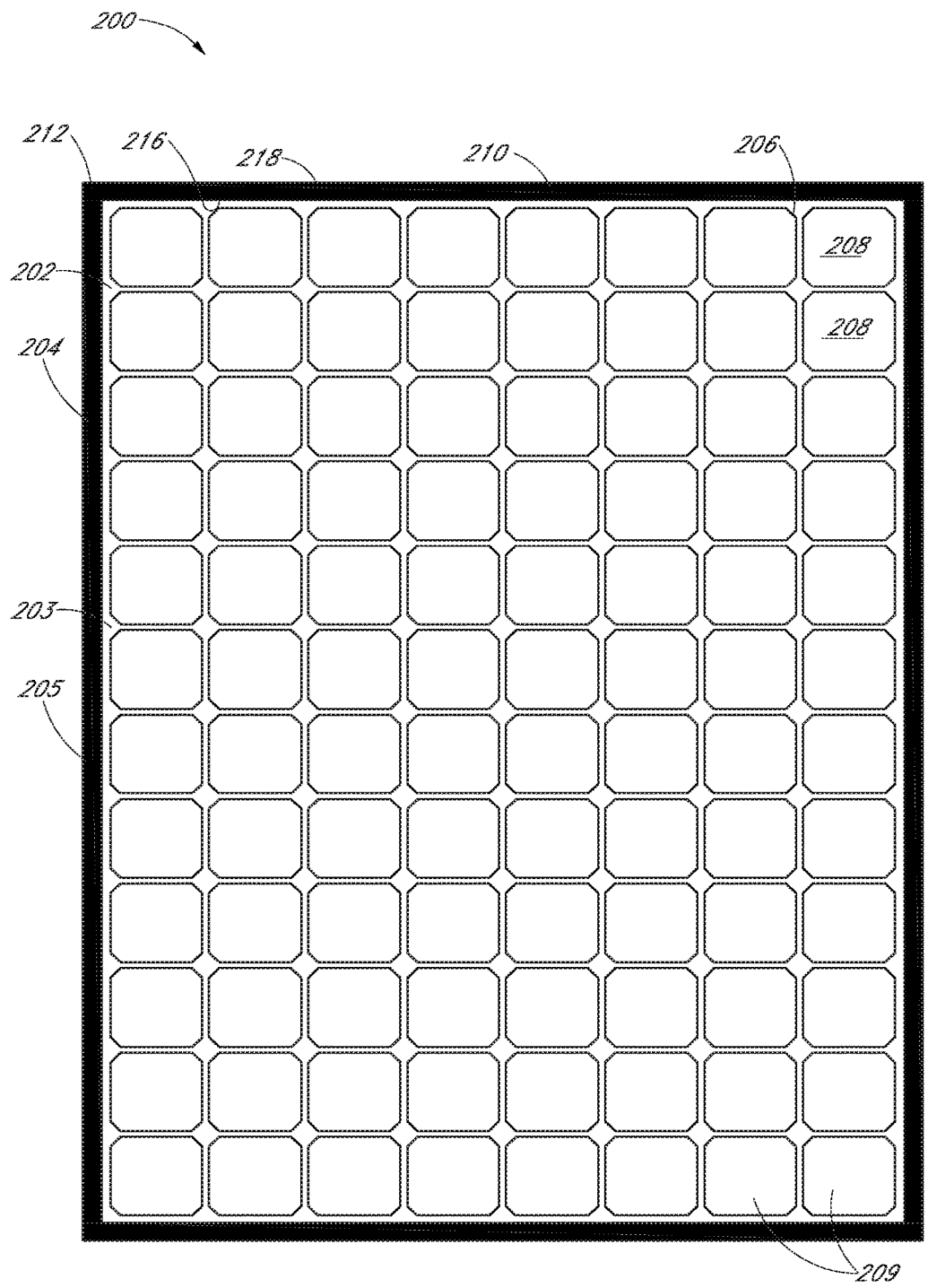
FIG. 4 depicts a front side of a photovoltaic module comprising a frame, in accordance with an embodiment of the present disclosure.

FIG. 4 illustrates a top-down view of a module 200 having a front side 202 that faces the sun during normal operation and a back side 204 opposite the front side 202. As depicted in FIG. 4, module 200 has a support member or frame 210 surrounding the laminate 206. The frame 210 around the perimeter of the laminate 206 defines an inner boundary 216 and an outer boundary 218. The frame 210 can be formed of a metal (e.g., aluminum) material, a polymeric material, or a combination thereof. In other embodiments, a support member or frame can partially surrounding the laminate.

In one embodiment, the frame 210 can be integrally formed or be formed as a unitary body. In another embodiment, the frame can be formed from an assembly of parts, for example such as depicted in FIG. 5.

Figure 5:
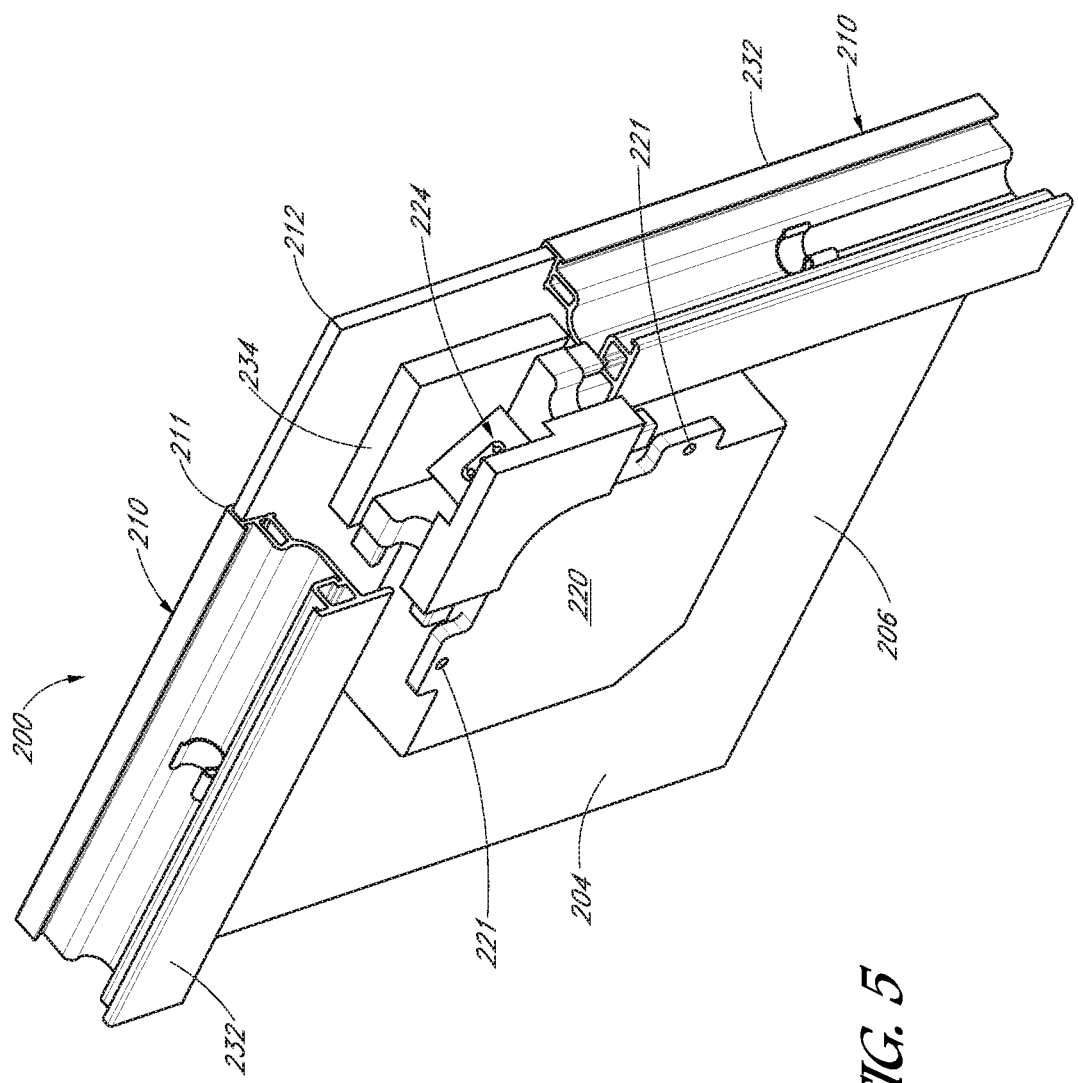
FIG. 5 depicts an exploded view of a back side of a portion of a photovoltaic module comprising a frame, in accordance with an embodiment of the present disclosure.
Figure 6:
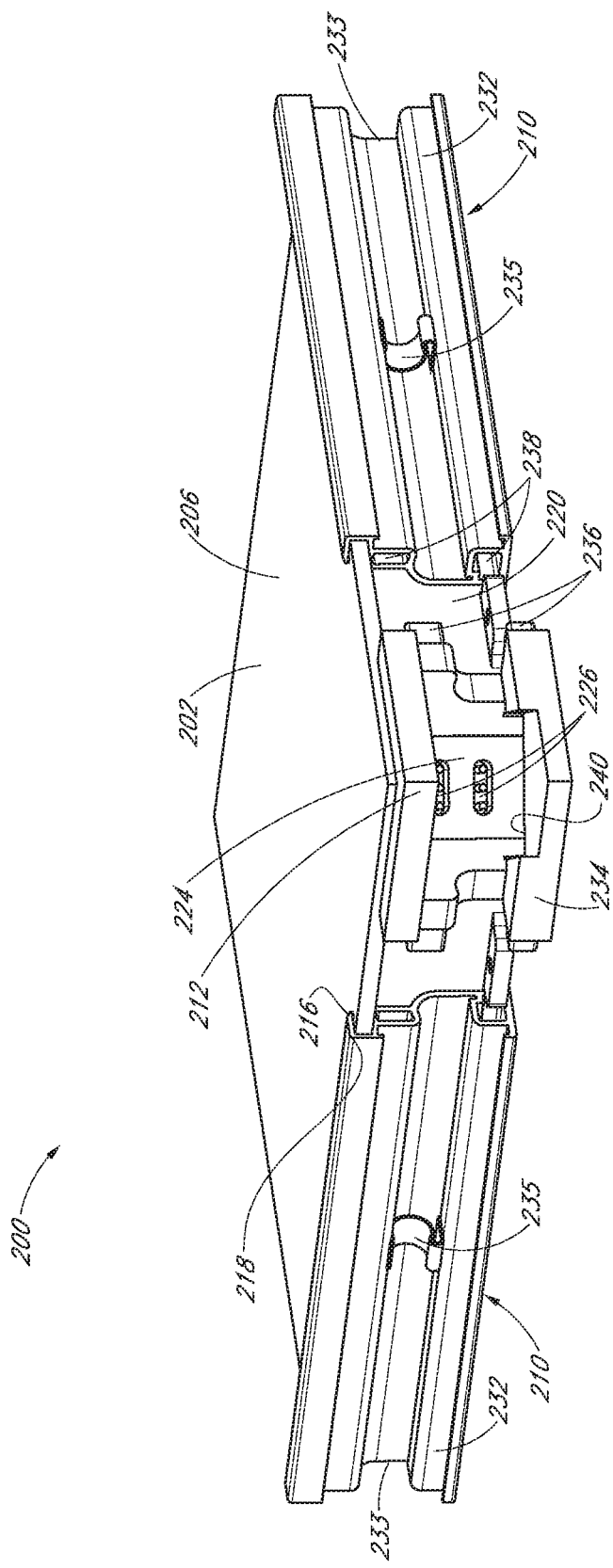
FIG. 6 depicts an exploded side view of a portion of a photovoltaic module comprising a frame, in accordance with an embodiment of the present disclosure.

FIG. 5 depicts an exploded view of the back side 204 of a corner portion of module 200 having electronic component 220 for conditioning power generated by the several solar cells 208. The frame 210 can have a lip 211 extending over and capturing upper and lower surfaces of the laminate 206. The electronic component 220 has a conditioned power connector port 224 facing the vertex of the first corner 212 of the laminate 206 and frame 210. The vertex may be a location at corner 212 where frame members of frame 210 meet. For example, frame members of frame 210 may extend longitudinally along respective frame axes, and the frame axes may extend orthogonal to each other at the vertex. Accordingly, the vertex may be a geometric location defined by the frame axes. Alternatively, the vertex may be a physical location on a module component, e.g., at the corner of laminate 206. In embodiments where the module 200 is an ACPV module, the conditioned power connector port 224 can be an AC connector port 224.

The electronic component 220 is coupled to the back side 204 of the laminate 206 at or towards the first corner 212. The electronic component 220 can be coupled to the laminate 106 and/or frame 110 (if present) through any desired coupling device, feature or mechanism including but not limited to one or more of adhesives, fasteners (e.g., screws, bolts, rivets, etc.), snap-in features, compressible features, adhesives, or any other desirable system for reversible or permanent mounting. The electronic component 220 can have mating features for mechanically coupling to a corresponding mating feature of the frame 210. The electronic component 220 can be coupled to the frame 210 via one or more fasteners. For example, electronic component 220 can have a tab, hole or cavity 221 which can accept a screw extending through a corresponding opening of the frame 210.

FIG. 6 depicts an exploded side view of a portion of module 200 at first corner 212. The frame 210 has several frame members 232. The frame 210 further has a corner key 234 at first corner 212 of laminate 206. The corner key 234 can rigidly connect the several frame members 232. In one embodiment the frame members 232 are arranged at substantially right angles to each other and corner key 234 rigidly connects frame members 232 into a quadrangular configuration such as depicted in FIG. 4-6.

Figure 9:
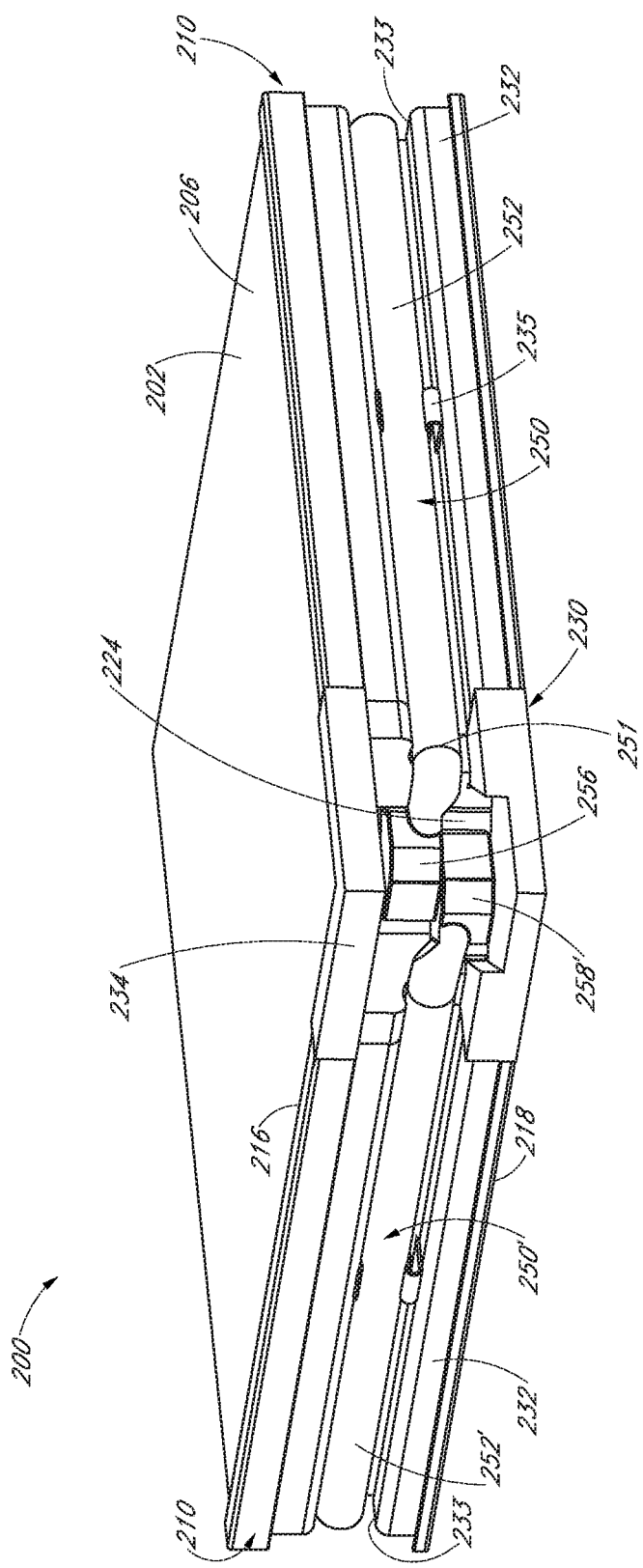
FIG. 9 depicts a side perspective view of a portion of a photovoltaic module comprising a frame, in accordance with an embodiment of the present disclosure.

In an embodiment, corner key 234 engages adjacent frame members 232 to form a corner joint of the frame 210. The corner joint can be a location where the frame members are physically joined. The corner joint may be a location where the frame members are rigidly joined (FIG. 9). The corner key 234 can have engagement features configured for insertion into corresponding engagement slots of adjacent frame members 232 so as to rigidly connect adjacent frame members 232 to form corner joint 230 of frame 210. In the exemplary embodiment depicted in FIG. 5-6, corner key 234 has engagement tabs 236 configured for insertion into corresponding engagement slots 238 of frame members 232. Any desirable engagement or mating feature to connect frame members and/or corner keys can be employed. In one embodiment, a corner joint or feedthrough joint is formed from interconnected frame members. However in other embodiments, a corner joint or feedthrough joint can be integrally formed or formed as a unitary frame, for example cut-outs or apertures in a unitary frame can be provided as one or more feedthrough openings.

In an embodiment, the frame or corner key has at least one feedthrough opening at or near the first corner. As depicted in FIG. 5-6, the feedthrough opening 240 creates an open space or void between the inner boundary 216 and outer boundary 218 at corner 212. For example, the feedthrough opening may be a hole formed laterally through a wall of corner key 234. The wall may be vertical, e.g., in a direction orthogonal to a face of laminate 206, and the opening may extend laterally, e.g., in a direction parallel to the face of laminate 206. The hole may have a rectangular, circular, or any other shaped profile to allow access through the wall of corner key 234 from outer boundary 218 to inner boundary 216. The electronic component 220 has a conditioned power connector port 224 facing the feedthrough opening 240 such that the conditioned power connector port 224 is accessible from the outer boundary 218 of the frame 210. In the exemplary embodiment depicted in FIG. 6, the conditioned power connector port 224 of the electronic component 220 has several stacked plugs 226. Each stacked plug 226 may be accessible through feedthrough opening 240 extending through corner key 234.

Figure 7:
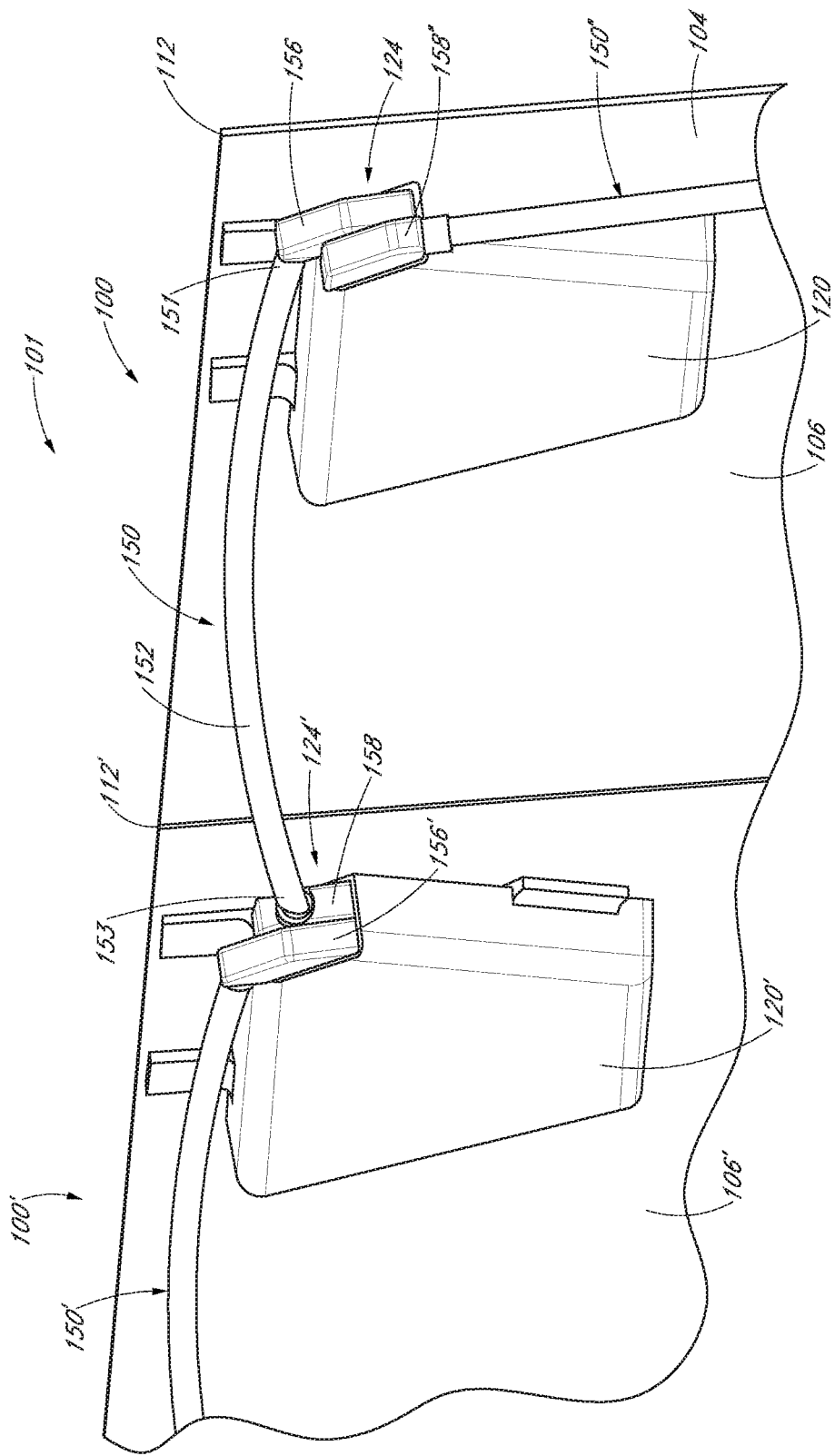
FIG. 7 depicts a back side of a photovoltaic array, in accordance with an embodiment of the present disclosure.

In an embodiment, wires or cables can electrically connect several modules to form a PV array. FIG. 7 depicts a back side 104 of a PV array 101 having a first module 100 and a second module 100'. A first connecting cable or "jumper" cable 150 has a first end 151 and a second end 153 with a conductor body 152 therebetween. In an embodiment, the conductor body 152 has an electrically conductive core being electrically insulated throughout its length. Connecting or jumper cables can be flexible, semi-flexible or rigid. For example, cable 150 depicted in FIG. 7 is semi-flexible such that the conductor body 152 can be slightly bowed. However, in other embodiments, the conductor body can be substantially rigid, straight and/or linear.

The first jumper cable 150 further has a first angled connector terminal 156 at the first end 151 and second connector terminal 158 at the second end 153. The first angled connector terminal 156 is configured to be electrically mated with the conditioned power connector port 124 of the first module 100. The second angled connector terminal 158 is configured to be electrically mated with the conditioned power connector port 124' of the second module 100'. The cable 150 electrically connects the first module 100 and the second module 100' via the conditioned power connector port 124 of the first module 100 and the conditioned power connector port 124' of the second module 100'. Similarly, the cable 150' connects the conditioned power connector port 124' of the second module 100' to a third module (not depicted in FIG. 7) and the cable 150" connects the conditioned power connector port 124 of the first module 100 to a fourth module (not depicted in FIG. 7). As depicted, the cable 150 connects adjacent modules 100/100', however, in various embodiments, connecting or jumper cables can electrically connect more distant or non-neighboring modules in an array.

In an embodiment, the angled connector terminals and/or their respective faces are disposed at a predetermined offset angle so as to face or align with conditioned power connector port. In an embodiment, the predetermined offset angle of the connector terminals 156/158 can be less than or equal to 90° relative to the conductor body 152 and/or relative to an edge of the laminate 106. For example, angled connector terminal 156 of cable 150 depicted in FIG. 8 has an face 162 provided at an angle θ (approximately 45°) relative to conductor body 152 so as to connect with the angled conditioned power connector port 124 facing corner 112 of module 100. The angled connector terminal 156 has a socket 164 having several holes 166 configured to engage with corresponding pins 128 of plug 126 of the conditioned power connector port 124. In the exemplary embodiment depicted in FIG. 8, the socket 164 has three holes 166 configured to be mated with the connector port 124, however any desirable number of holes or connection features can be provided. The socket 164 further has a gasket 168 and alignment tables 169 for securely connecting to the plug 126 of the conditioned power connector port 124, however any other desirable mating or connecting features can be provided.

Figure 8:
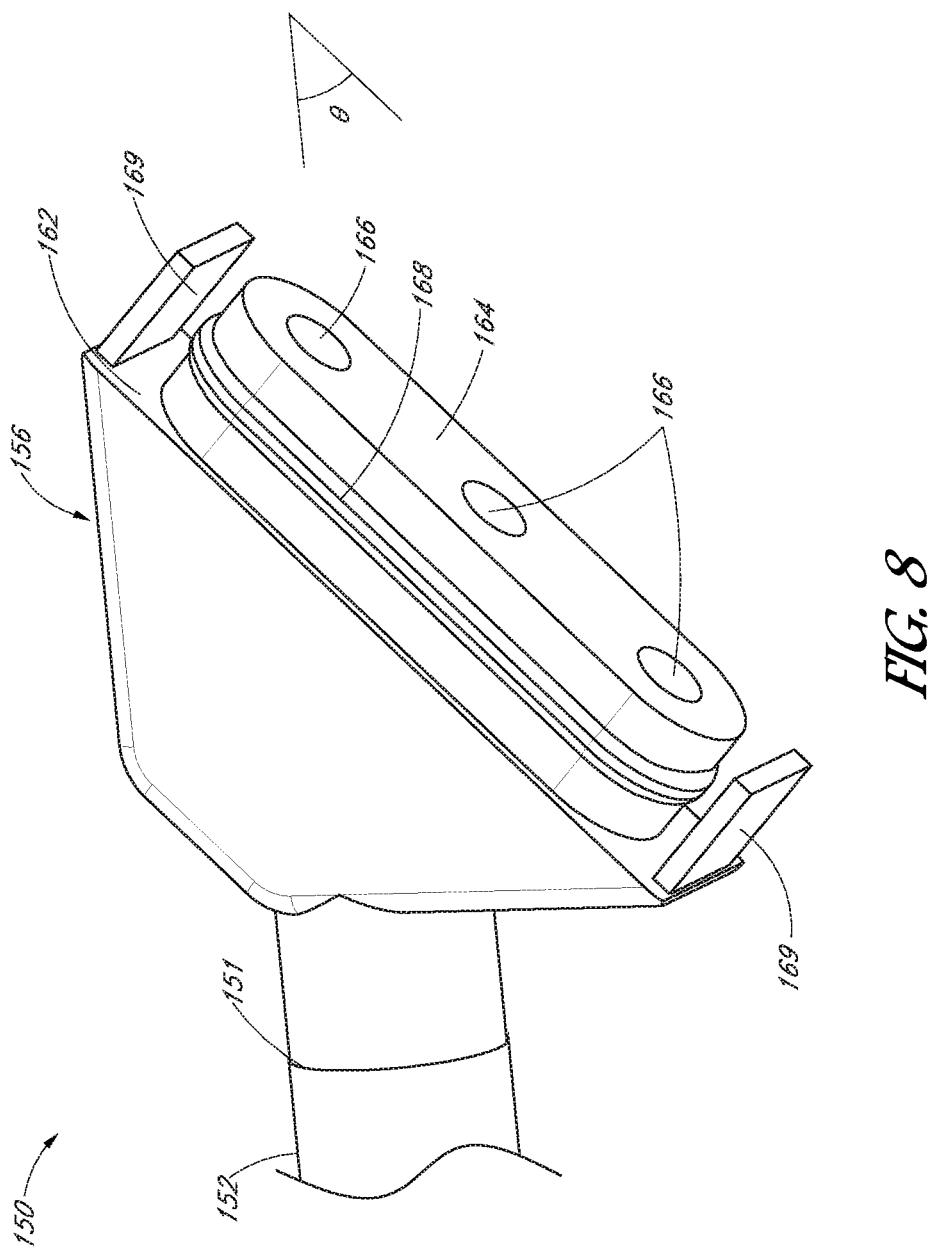
FIG. 8 depicts an angled connector terminal, in accordance with an embodiment of the present disclosure.

FIGS. 7-8 illustrate PV modules and assemblies having wires or cables according to one embodiment. Unless otherwise designated, the components of FIGS. 9-10 are similar, except that corresponding numerals in FIGS. 9-10 are incremented sequentially by 100.

FIG. 9 depicts a side perspective view of a portion of module 200 having wires or cables for electrically connecting to other modules to form a PV array. A first connecting cable or "jumper" cable 250 has a conductor body 252 having a first end 251. FIG. 9 shows an assembled corner region of PV module 200. More particularly, corner key 234 is engaged with adjacent frame members to form a corner joint. In the embodiment depicted in FIG. 9, the conductor body 252 of cable 250 is directed or routed along an outer boundary 218 of frame 210. The frame 210 has channels 233 sized and shaped to hold conductor body 252 of cable 250. In one embodiment, the conductor body 252 of cable 250 is substantially rigid and linear. In some embodiments, seating clips 235 are provided to seat or maintain conductor body 252 in channel 233. In other embodiments, seating features can be integrally formed with frame member 232. Similarly, conductor body 252' of cable 250' is directed or routed along an outer boundary 218 of frame 210 within channel 233.

In the embodiment depicted in FIG. 9, a first angled connector terminal 256 of cable 250 is electrically mated with conditioned power connector port 224 of module 200. A second angled connector terminal 258' of cable 250' is configured to be electrically mated with conditioned power connector port 224 of module 200 in a stacked configuration. The cables 250/250' electrically connect module 200 to other adjacent modules, other non-neighboring modules and/or an external load via the conditioned power connector port 224.

Figure 10:
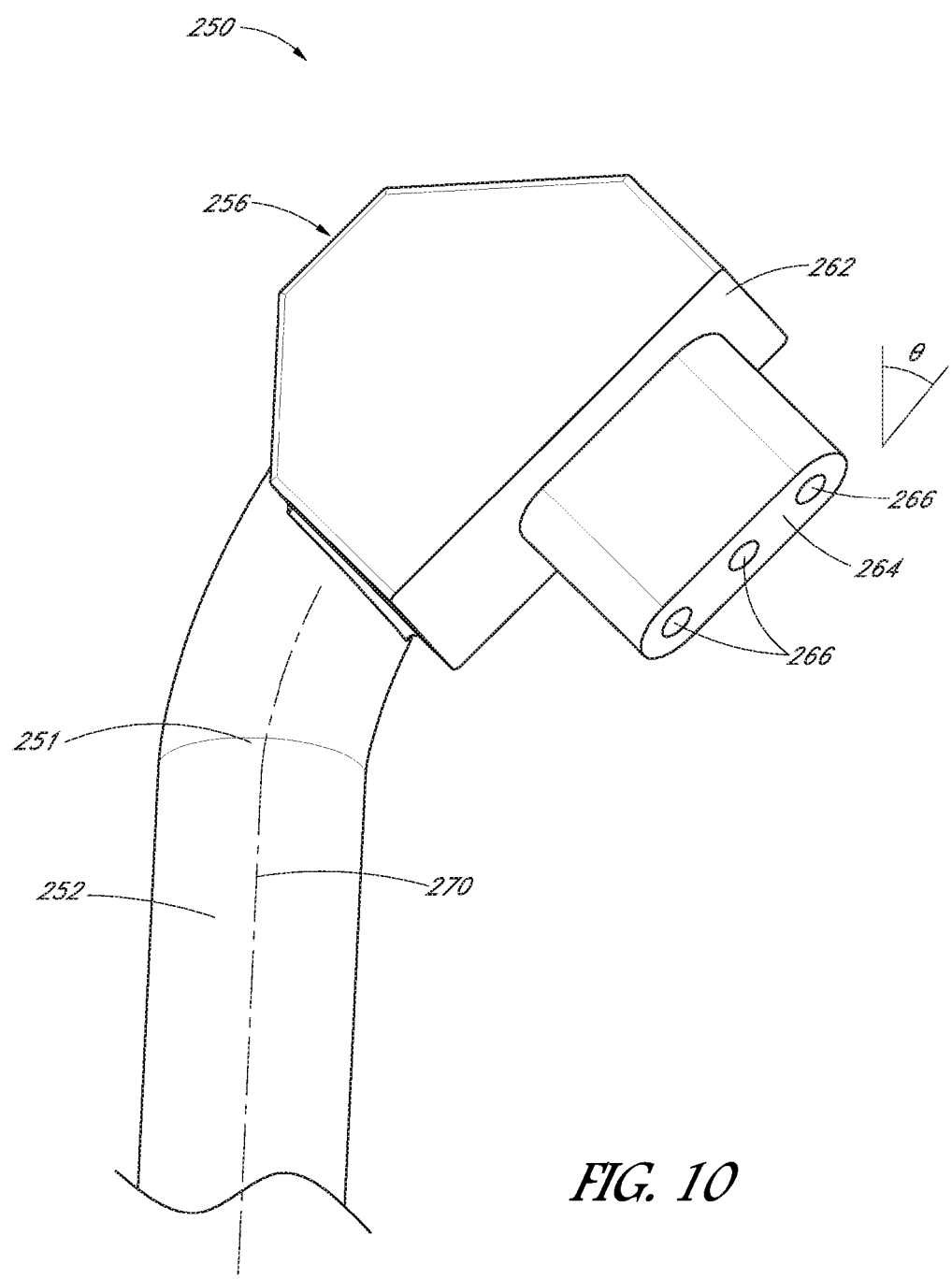
FIG. 10 depicts an angled connector terminal, in accordance with an embodiment of the present disclosure.

As depicted in FIG. 10, the angled connector terminal 256 of cable 250 has a face 262 provided at angle θ (approximately 45°) relative to a longitudinal axis 270 of conductor body 252 so as to connect with the angled conditioned power connector port 224. The angled connector terminal 256 has a socket 264 having several holes 266 configured to engage with corresponding plug 226 of the conditioned power connector port 224 (visible in FIG. 6).

Employing angled connectors and corner power conditioning ports at module corners can facilitate flexibility in solar array configuration and installation. Angled connectors allow redirection of cables and wires for a diverse set of arrays using angled connectors and corner ports described herein. In other words, an angled connector approach allows multiple changes in wire routing direction from module corner ports.

FIGS. 1-10 illustrate PV modules and assemblies according to various embodiments. Unless otherwise designated, the components of FIGS. 11-14 are similar, except that corresponding numerals of FIGS. 11-14 are incremented sequentially by 100.

Figure 11:
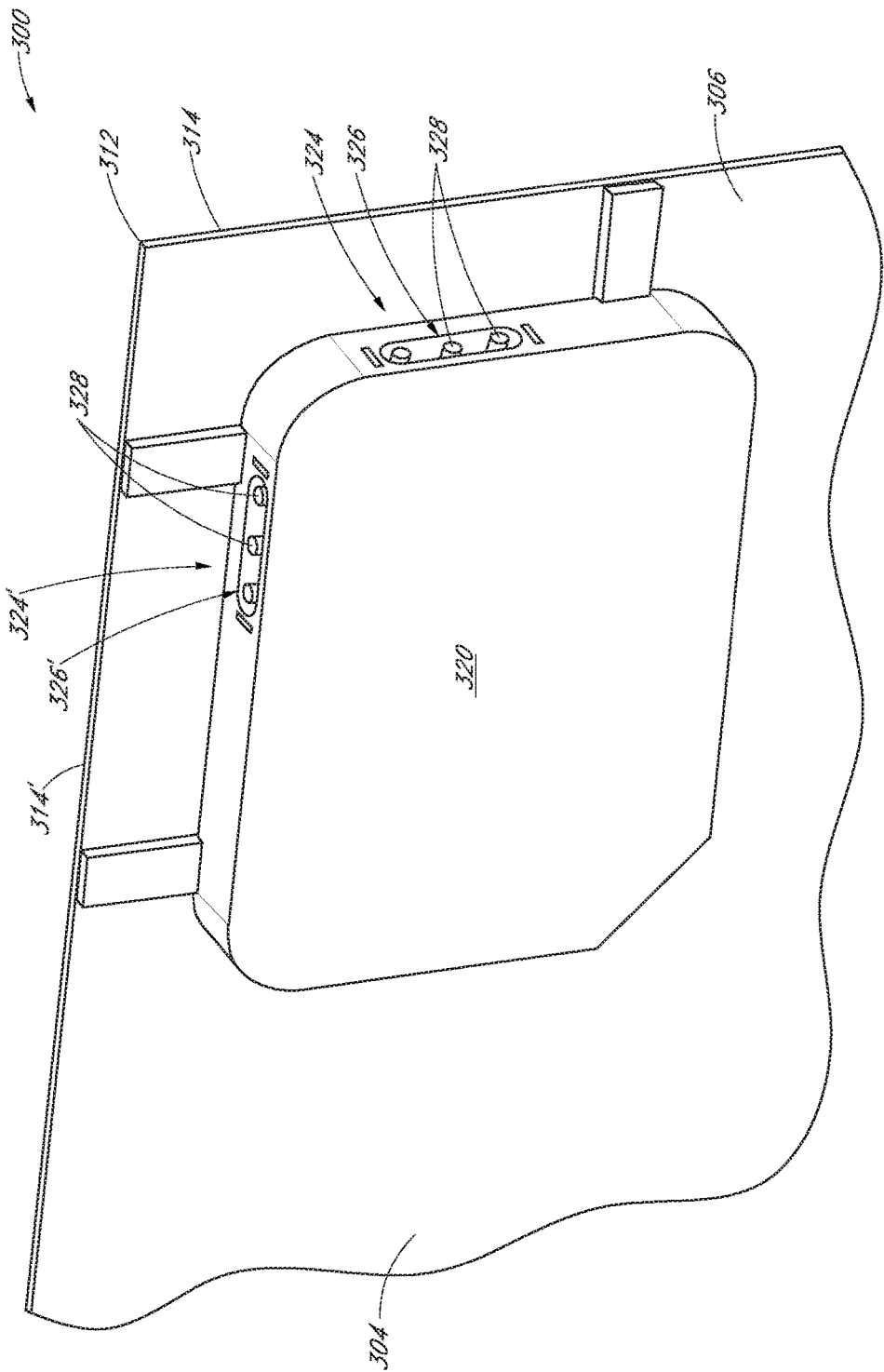
FIG. 11 depicts a back side corner portion of a photovoltaic module, in accordance with an embodiment of the present disclosure.

FIG. 11 depicts a back side 304 of a portion of a module 300 having electronic component 320. The electronic component 320 is situated near corner 312 of laminate 306. The electronic component 320 has a first conditioned power connector port 324 facing a first edge 314 adjacent to corner 312 of laminate 306. The electronic component 320 further has a second conditioned power connector port 324' facing a second edge 314' adjacent to corner 312 of laminate 306. Each conditioned power connector port 324/324' has a single plug 326 and each plug 326 has several pins 328. As depicted, a face of one or more of the conditioned power connector port 324/324' is parallel to an edge of the laminate 306. In the exemplary embodiment depicted in FIG. 11, a single plug 326 is provided towards a first edge 314 of corner 312 and a single plug 326' is provided towards a second edge 314' near corner 312. However in other embodiments, any desired number of plugs in any configuration (e.g., stacked) can be provided towards either edge (a single edge or both edges) near a corner 312 of laminate 306.

Figure 12:
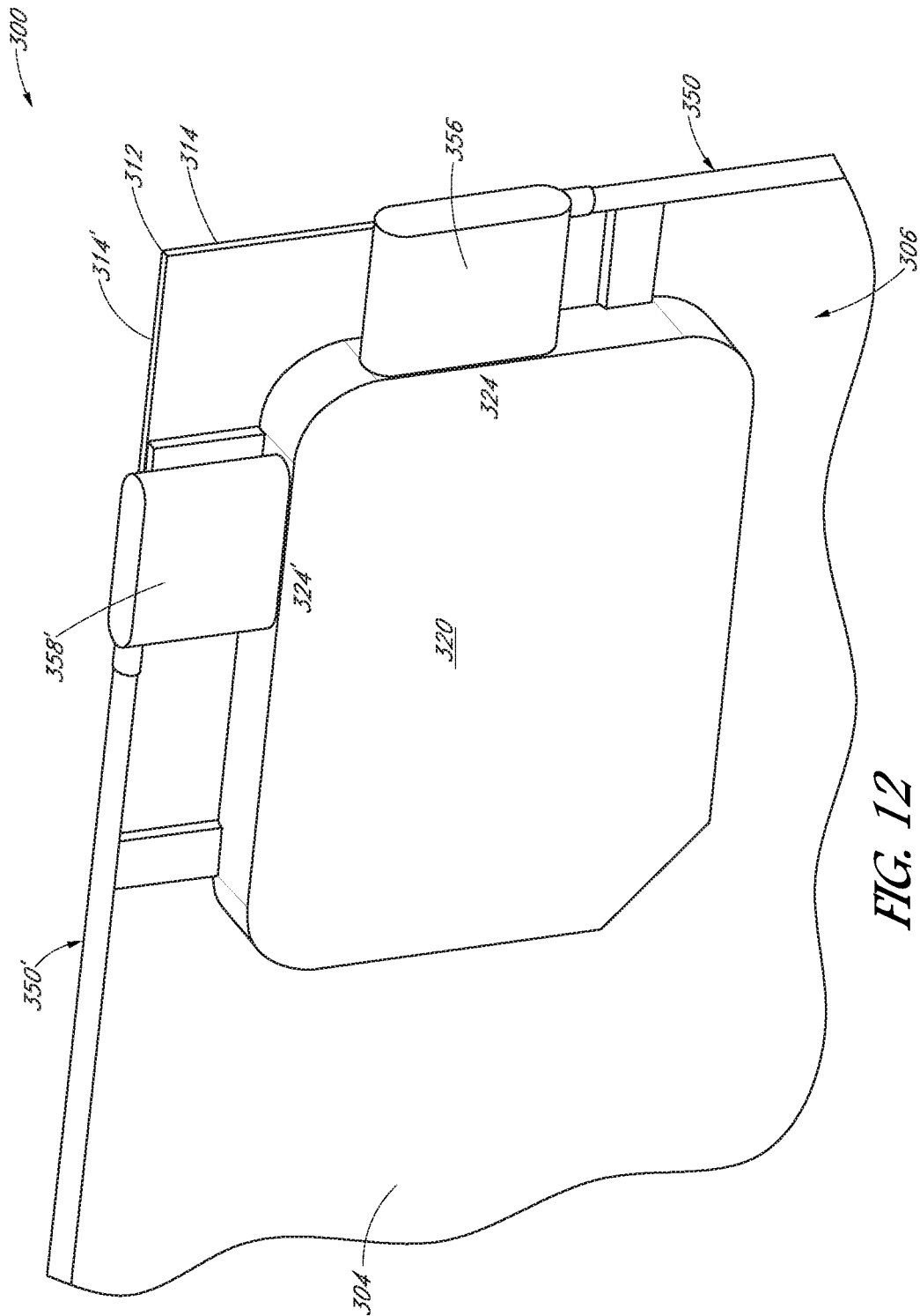
FIG. 12 depicts a back side corner portion of a photovoltaic module, in accordance with an embodiment of the present disclosure.

FIG. 12 depicts back side 304 of module 300 having jumper cables 350/350'. A first connecting cable or "jumper" cable 350 has a first angled connector terminal 356 and is configured to be electrically mated with the conditioned power connector port 324 of the electronic component 320. A second connecting cable or "jumper" cable 350' has a second angled connector terminal 358' and is configured to be electrically mated with the conditioned power connector port 324' of the electronic component 320.

Figure 13:
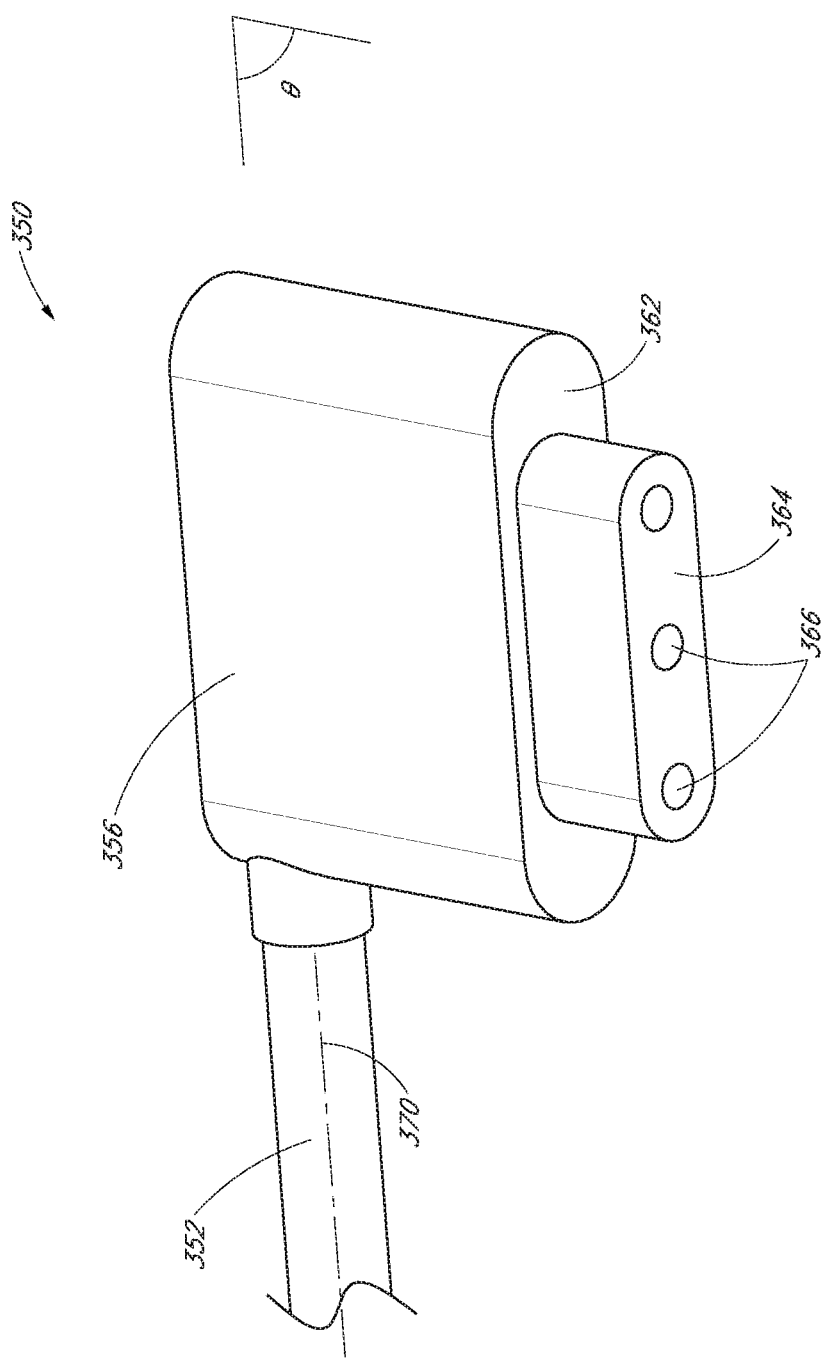
FIG. 13 depicts an angled connector terminal, in accordance with an embodiment of the present disclosure.

As depicted in FIG. 13, the angled connector terminal 356 of cable 350 is angled at approximately 90° to a longitudinal axis 370 of conductor body 352 so as to connect with the angled conditioned power connector port 324. As depicted, angled connector terminal 356 has a face 362 that is substantially parallel relative to the longitudinal axis 370 of conductor body 352. The angled connector terminal 356 has a socket 364 having several holes 366 configured to engage with corresponding plug 326 of the conditioned power connector port 324 (visible in FIG. 11).

Figure 14:
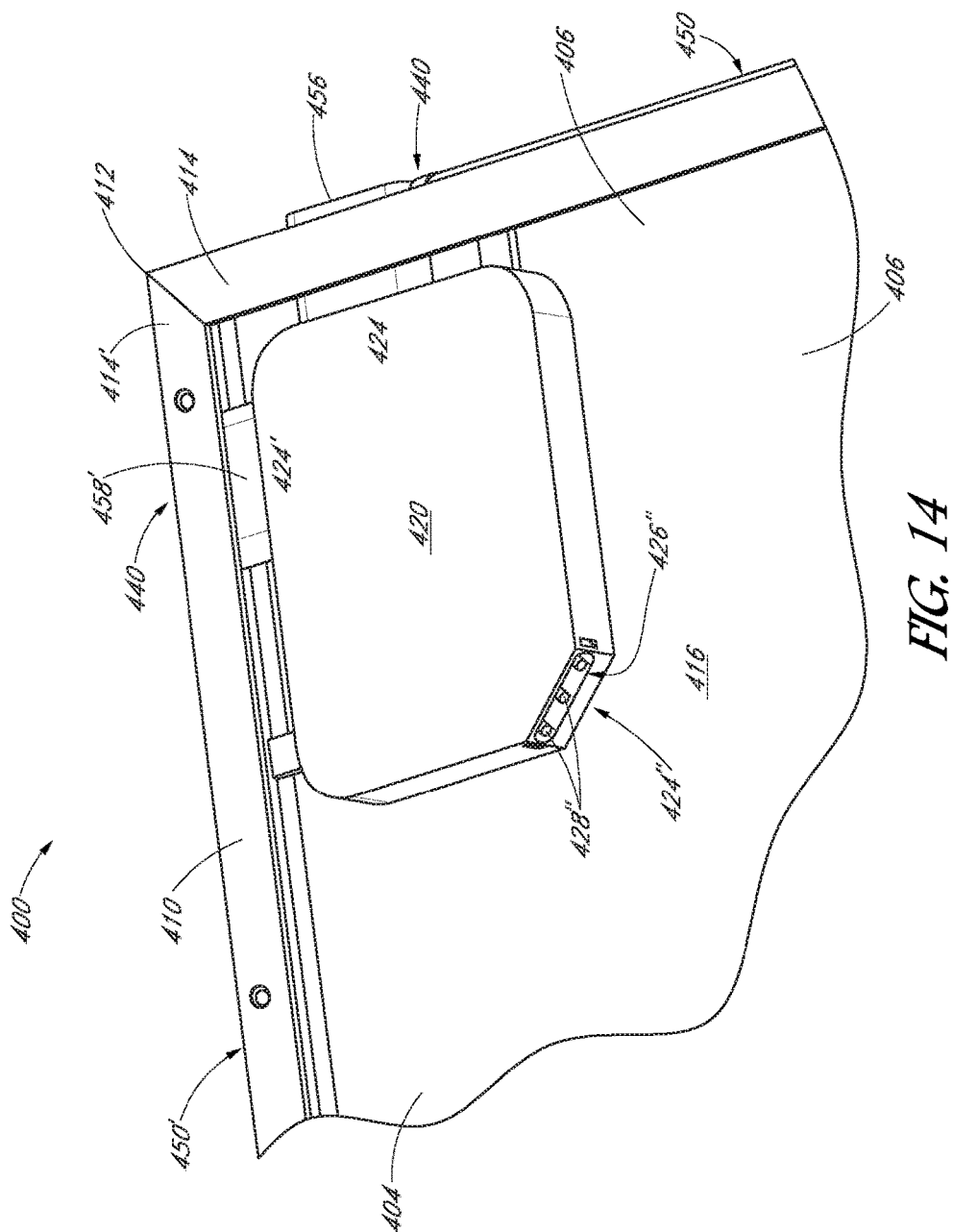
FIG. 14 depicts a back side corner portion of a photovoltaic module having a frame, in accordance with an embodiment of the present disclosure.

FIG. 14 depicts a back side 404 of a portion of a module 400 having a unitary frame 410. The frame 410 has feedthrough openings 440 at edges 414/414' near corner 412 such that electrical connectors 456/458' can extend therethrough, thereby connecting cables 450/450' to conditioned power connector ports 424/424'. The feedthrough openings are hidden behind frame 410, but it will be appreciated that the openings may extend laterally, e.g., in a direction parallel to a face of laminate 406, through respective frame members. For example, a first feedthrough opening 440 may extend laterally through a frame member having edge 414, and a second feedthrough opening 440 may extend through a frame member having edge 414'. The feedthrough openings may be holes having respective hole profiles. Alternatively, the feedthrough openings may be portions of a large opening extending around corner 412, e.g., the hole may extend from edges 414, 414' at corner 412 vertically to laminate 406. In other embodiments, one or more feedthrough openings can be provided at a corner of a unitary frame. The electronic component 420 has a first conditioned power connector port 424 facing first edge 414 adjacent to corner 412 and a second conditioned power connector port 424' facing second edge 414' adjacent to corner 412. In some embodiments, the electronic component 420 further has a third conditioned power connector port 424" facing the inner portion 416 (laterally inward of frame 410) of frame 410 and/or opposite corner 412. For example, an inner-facing conditioned power connector port 424" can output conditioned power (e.g., AC power of an ACPV module) to an external load. In one embodiment, the inner-facing conditioned power connector port 424" of a terminal module 400 of an array can connect to an external load, a transition box and/or a combiner box whereas other modules in the same array can have inner-facing conditioned power connector ports which remain unconnected. In an embodiment, an inner-facing conditioned power connector port 424" can have a plug 426" with several pins 428". In an embodiment, an inner-facing conditioned power connector port can have any desired number of plugs in any configuration (e.g., stacked) towards a center or edge of laminate 406.

FIGS. 1-15 illustrate PV modules and assemblies according to various embodiments. Unless otherwise designated, the components of FIGS. 15-18 are similar, except that corresponding numerals of FIGS. 15-18 are incremented sequentially by 100.

Figure 15:
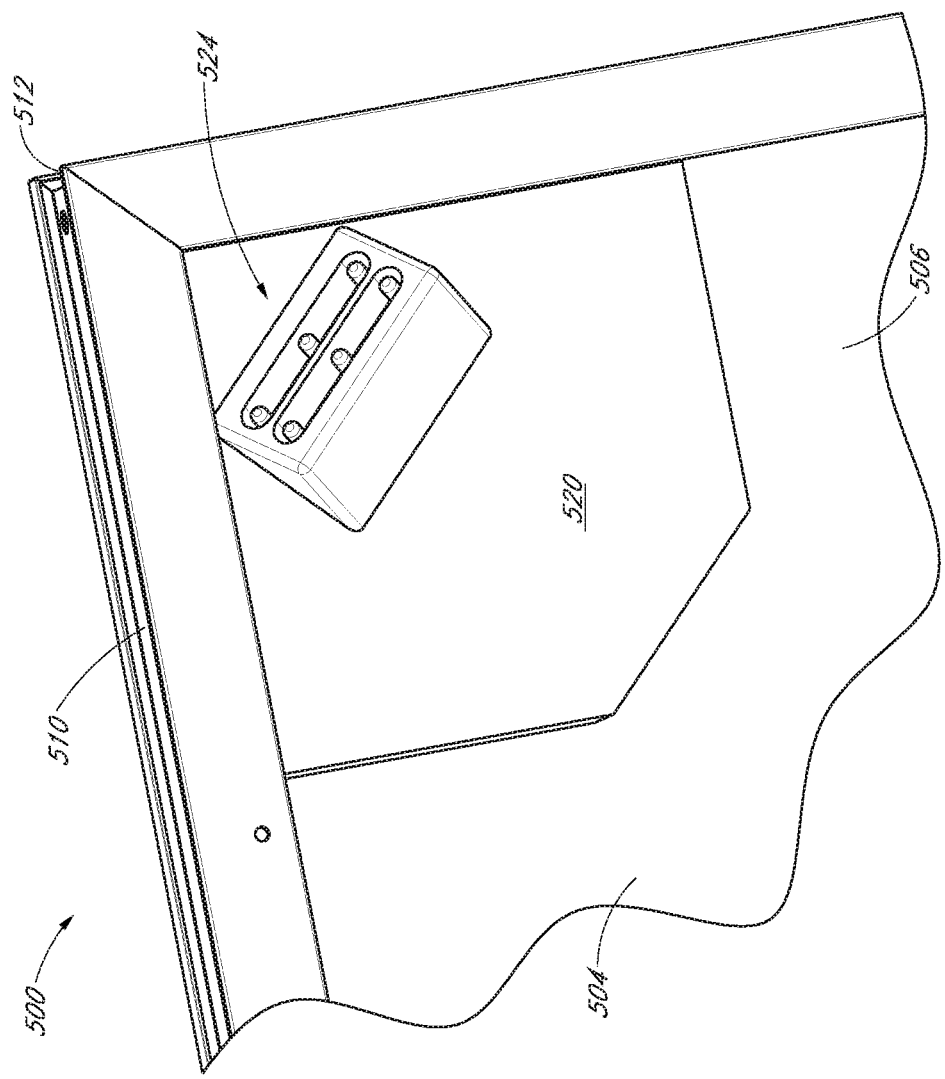
FIG. 15 depicts a back side corner portion of a photovoltaic module having a frame, in accordance with an embodiment of the present disclosure.

In an embodiment, the conditioned power connector port can be angled greater or less than 45° from an edge of the laminate, from the plane of the laminate, or a combination thereof. Referring to FIG. 15, the module 500 has a conditioned power connector port 524 that is angled from the plane of the laminate 506 (e.g., approximately 45° from the plane of the laminate 506). For example, the conditioned power connector port 524 can have a port face that is oblique to the plane of the laminate 506, and the angle between the port face and the plane can be in a range of 30° to 60°. The module 500 further has a frame 510, however in other embodiments the module 500 can be frameless. Given the configuration of the angled conditioned power connector port, the frame 510 does not have feedthrough openings through which electrical connectors can extend. In various embodiments, the conditioned power connector port can be angled by a combination of offsets from the laminate edge and/or plane.

Figure 16:
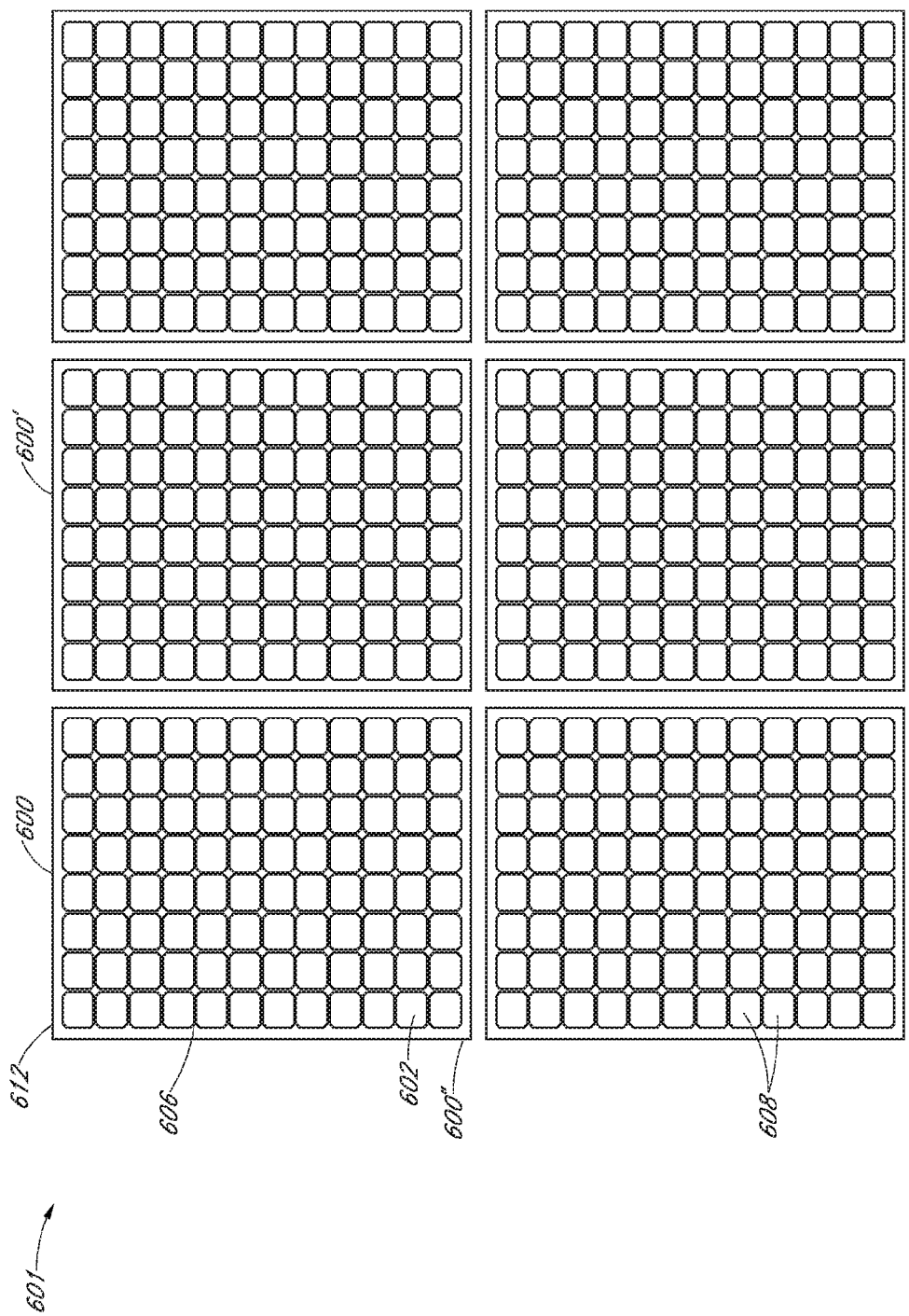
FIG. 16 depicts a front side of a photovoltaic array, in accordance with an embodiment of the present disclosure.
Figure 17:
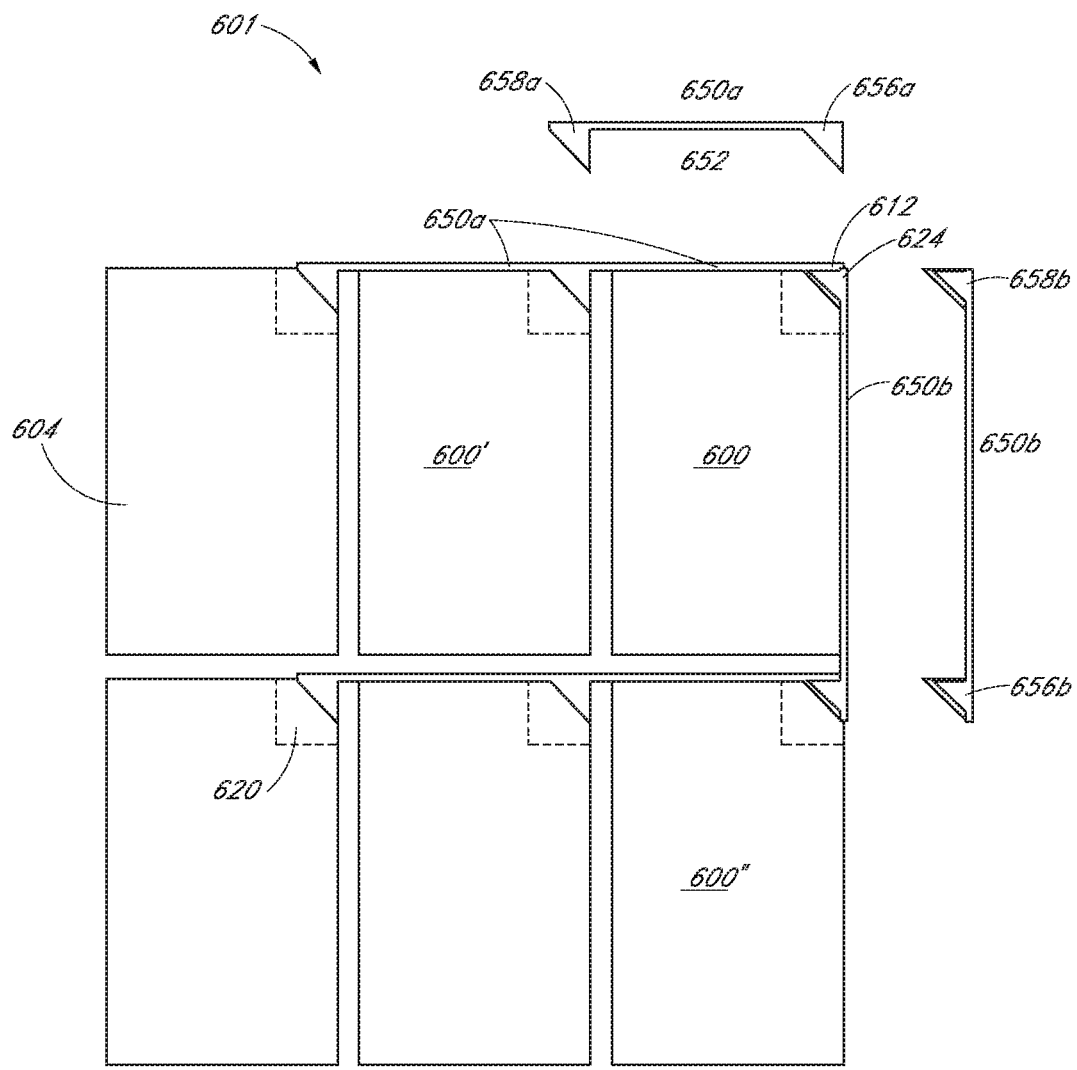
FIG. 17 depicts a front side of a photovoltaic array, in accordance with an embodiment of the present disclosure.

FIG. 16 illustrates a top-down view of a PV array 601 having several modules 600 (individual modules depicted as 600, 600', 600"). Each module 600 has a front side 602 that faces the sun during normal operation and a laminate 606 having several solar cells 608. The PV array 601 can be configured in a "portrait" orientation as depicted in FIG. 16. FIG. 17 depicts a back side 604 of a PV array having PV modules 600 configured in a "portrait" orientation. Each module 600 of array 601 has an electronic component depicted by dashed lines at 620 for conditioning power generated by the several solar cells 608. Each electronic component 620 has a conditioned power connector port 624 at corner 612.

Several connecting cables or "jumper" cables of a first type 650a having a first length connect modules 600 along the width of modules 600. Similarly, connecting cables or "jumper" cables of a second type 650b having a second length longer than the first length connect modules 600 along the height of modules 600. The connecting cables of the first type 650a each have a first angled connector terminal 656a and second angled connector terminal 658a. The connecting cables of the second type 650b each have a first angled connector terminal 656b and second angled connector terminal 658b. In an embodiment, the first angled connector terminal 656a is configured to be electrically mated with the conditioned power connector port 624 of first module 600. The second angled connector terminal 658a is configured to be electrically mated with the conditioned power connector port of second module 600'. Similarly, the first angled connector terminal 656b is configured to be electrically mated with the conditioned power connector port of a third module 600" and the second angled connector terminal 658b is configured to be electrically mated with the conditioned power connector port 624 of first module 600. As depicted, the first angled connector 656a is angled inward (e.g., inward facing toward conductor body 652) and second angled connector 658a is angled outward (e.g., facing outward from conductor body 652). However in other embodiments, both angled connectors can be facing inward, both angled connectors can be facing outward, or any other desired configuration for connection to conditioned power connector ports of electronic components.

The cables 650a electrically connect the first module 600 to adjacent modules in a row of the array 601 via corner conditioned power connector ports 624. Similarly, cables 650b can connect the first module 600 to adjacent modules in a column of array 601 via corner conditioned power connector ports 624. As depicted, the cables 650a/650b connect adjacent or neighboring modules 600, however, in various embodiments, connecting or jumper cables can electrically connect more distant or non-neighboring modules of an array.

Figure 18:
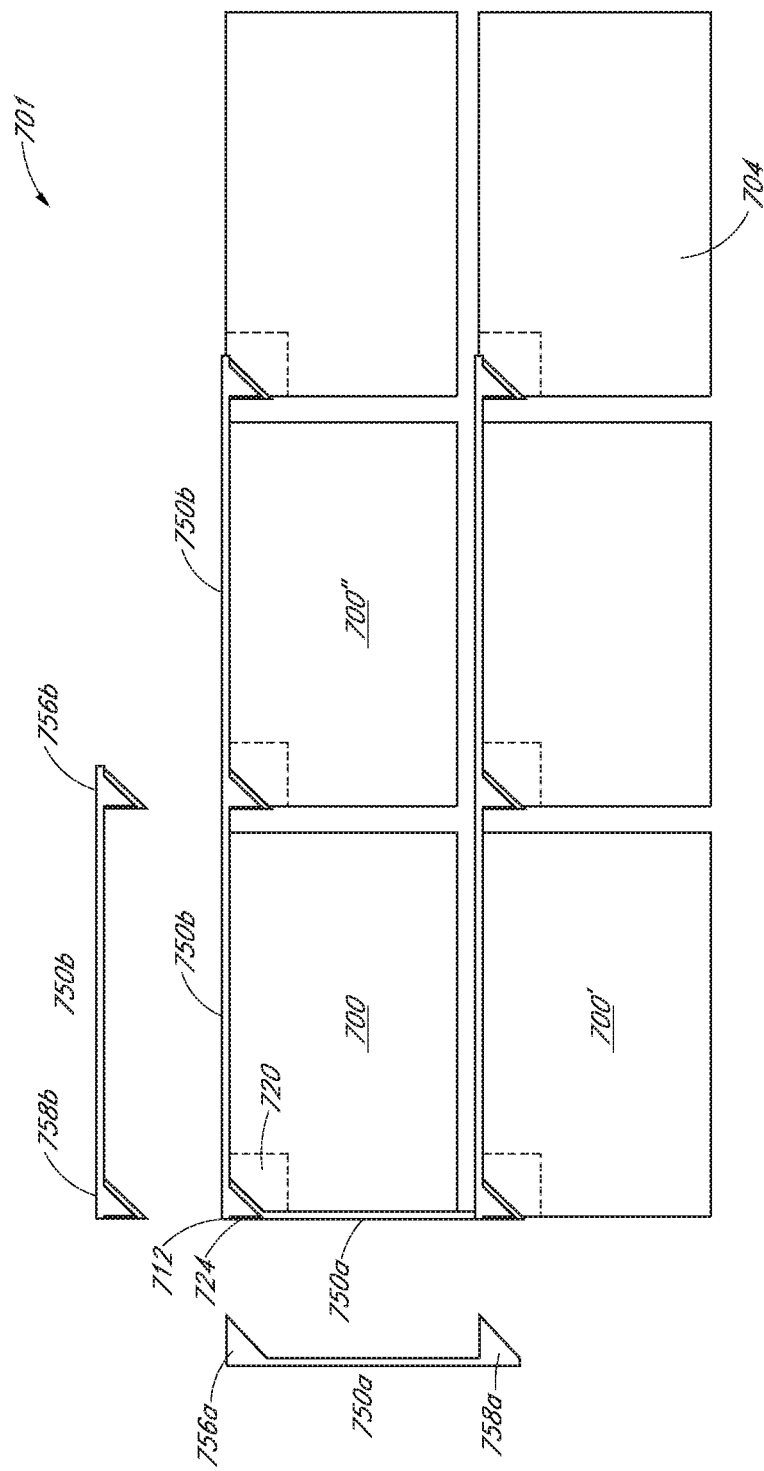
FIG. 18 depicts a front side of a photovoltaic array, in accordance with an embodiment of the present disclosure.

FIG. 18 depicts a back side 704 of a PV array 701 having PV modules 700 (individually depicted as 700, 700', 700") configured in a "landscape" orientation. Each module 700 of array 701 has an electronic component depicted by dashed lines at 720. Each electronic component 720 has a conditioned power connector port 724 at corner 712. Several connecting cables of a first type 750a having a first length connect modules 700 along the module width. Similarly, connecting cables 750b having a second length longer than the first length connect modules 700 along the module height. The connecting cables of the first type 750a each have a first angled connector terminal 756a and second angled connector terminal 758a. The connecting cables of the second type 750b each have a first angled connector terminal 756b and second angled connector terminal 758b. In an embodiment, the first angled connector terminal 756a is configured to be electrically mated with the conditioned power connector port 724 of first module 700. The second angled connector terminal 758a is configured to be electrically mated with the conditioned power connector port of second module 700'. Similarly, the first angled connector terminal 756b is configured to be electrically mated with the conditioned power connector port of a third module 700" and the second angled connector terminal 758b is configured to be electrically mated with the conditioned power connector port 724 of first module 700.

The cables 750a electrically connect the first module 700 to adjacent modules in a column of the array 701 via corner conditioned power connector ports 724. Similarly, cables 750b can connect the first module 700 to adjacent modules in a row of array 701 via corner conditioned power connector ports 724. As depicted, the cables 750a/750b connect adjacent or neighboring modules 700, however, in various embodiments, connecting or jumper cables can electrically connect more distant or non-neighboring modules of an array.

The above specification and examples provide a complete description of the structure and use of illustrative embodiments. Although certain embodiments have been described above with a certain degree of particularity, or with reference to one or more individual embodiments, those skilled in the art could make numerous alterations to the disclosed embodiments without departing from the scope of this invention. As such, the various illustrative embodiments of the methods and systems are not intended to be limited to the particular forms disclosed. Rather, they include all modifications and alternatives falling within the scope of the claims, and embodiments other than the one shown can include some or all of the features of the depicted embodiment. For example, elements can be omitted or combined as a unitary structure, and/or connections can be substituted. Further, where appropriate, aspects of any of the examples described above can be combined with aspects of any of the other examples described to form further examples having comparable or different properties and/or functions, and addressing the same or different problems. Similarly, it will be understood that the benefits and advantages described above can relate to one embodiment or can relate to several embodiments. For example, embodiments of the present methods and systems can be practiced and/or implemented using different structural configurations, materials, and/or control manufacturing steps. The claims are not intended to include, and should not be interpreted to include, means-plus- or step-plus-function limitations, unless such a limitation is explicitly recited in a given claim using the phrase(s) "means for" or "step for," respectively.

What is claimed is:

1. An alternating current photovoltaic (ACPV) assembly, comprising:
    a frame including a plurality of frame members between an inner boundary and an outer boundary;
    a corner key coupled to the plurality of frame members, wherein the corner key joins the plurality of frame members at a corner, and wherein the corner key includes a feedthrough opening between the inner boundary and the outer boundary at the corner; and
    an ACPV module mounted on the frame, wherein the ACPV module includes a PV laminate having a plurality of solar cells, an inverter electrically connected to the plurality of solar cells, and an alternating current (AC) connector port electrically connected to the inverter and having a port face facing the feedthrough opening and facing the corner, wherein the AC connector port is accessible from the outer boundary through the feedthrough opening, and wherein the AC connector port includes a plug and has an oblique angle with respect to sides of the PV laminate.

2. The ACPV assembly of claim 1, wherein the corner key includes a plurality of engagement features to insert into a plurality of engagement slots of the plurality of frame members.

3. The ACPV assembly of claim 1 further comprising a connecting cable having an angled connector terminal at an end of a conductor body, wherein the feedthrough opening is at a vertex of the corner, and wherein the angled connector terminal extends through the feedthrough opening to electrically connect to the AC connector port.

4. The ACPV assembly of claim 1 further comprising a connecting cable having an angled connector terminal at an end of a conductor body, wherein the angled connector terminal is at a predetermined offset angle oblique to a longitudinal axis of the conductor body.

5. The ACPV assembly of claim 4, wherein the predetermined offset angle is in a range between 45° to 90°.

6. The ACPV assembly of claim 1, wherein the plug has a first AC power pin, a second AC power pin, and a neutral grounding pin.

7. The ACPV assembly of claim 1, wherein the frame includes a channel along the outer boundary, and wherein a conductor body of a connecting cable is mounted in the channel.

8. The ACPV assembly of claim 1, wherein the ACPV module includes a junction box having a plurality of busbars penetrating into the laminate, and wherein the plurality of busbars are electrically connected to the plurality of solar cells.

9. A photovoltaic (PV) assembly, comprising:
    a frame including a frame member between an inner boundary and an outer boundary, wherein the frame includes a feedthrough opening through the frame member from the inner boundary to the outer boundary; and
    a PV module mounted on the frame, wherein the PV module includes
    a PV laminate having a plurality of solar cells encapsulated between a front side and a back side,
    an electronic component coupled to the back side of the PV laminate, wherein the electronic component conditions power generated by the plurality of solar cells, and wherein the electronic component includes a DC connector port electrically coupled to the plurality of solar cells, and a conditioned power connector port having a port face facing the feedthrough opening, and wherein the conditioned power connector port includes a plug, faces a corner of the PV laminate and has an oblique angle with respect to sides of the PV laminate.

10. The PV assembly of claim 9, wherein the electronic component includes an inverter for converting a direct current generated by the plurality of solar cells into an alternating current.

11. The PV assembly of claim 9, wherein the electronic component includes an electronic DC-to-DC optimizer.

12. The PV assembly of claim 9, wherein the conditioned power connector port outputs conditioned power to an external load.

13. The PV assembly of claim 9, wherein the plug has a pin, wherein the pin includes a pin axis extending through the feedthrough opening.

14. The PV assembly of claim 9 further comprising a cable electrically connected to the PV module, and electrically connected to a second PV module, wherein the cable includes
    a conductor body having a first end and a second end, and
    a first angled connector terminal at the first end and a second connector terminal at the second end;
    wherein the first angled connector terminal is electrically mated with the conditioned power connector port of the PV module and the second angled connector terminal is electrically mated with a second conditioned power connector port of the second PV module.

15. The PV assembly of claim 14, wherein the conditioned power connector port includes a plurality of stacked plugs, wherein each of the plurality of stacked plugs includes a plurality of connector pins, and wherein the first angled connector terminal includes a socket having a plurality of holes to engage with the plurality of pins.

16. The PV assembly of claim 14, wherein the first angled connector terminal is disposed at a predetermined offset angle oblique to a longitudinal axis of the conductor body.

17. The PV assembly of claim 14, wherein the conductor body is routed along the outer boundary of the frame.

18. A photovoltaic (PV) module, comprising:
a PV laminate having a plurality of solar cells encapsulated between a front side and a back side, wherein the back side includes a plurality of edges joined at a corner; and
an electronic component coupled to the back side of the PV laminate, wherein the electronic component conditions power generated by the plurality of solar cells, and
wherein the electronic component includes a DC connector port electrically coupled to the plurality of solar cells, and a conditioned power connector port having a port face facing the corner, and wherein the conditioned power connector port includes a plug and has an oblique angle with respect to the edges of the PV laminate.

19. The PV module of claim 18, wherein the electronic component includes an inverter to convert a direct current generated by the plurality of solar cells into an alternating current.

20. The PV module of claim 18 further comprising a frame mounted on the plurality of edges, wherein the electronic component is mounted on the frame.

21. A photovoltaic (PV) assembly, comprising:
a PV laminate having a plurality of solar cells encapsulated between a front side and a back side,
a frame including a plurality of frame members and at least partially surrounding the PV laminate;
a corner key coupled to the plurality of frame members, wherein the corner key joins the plurality of frame members at a corner of the PV laminate,
wherein the corner key includes a feedthrough opening; and
an electronic component including a DC connector port electrically coupled to the plurality of solar cells, and a conditioned power connector port having a port facing the feedthrough opening of the corner key and facing the corner of the PV laminate;
wherein the conditioned power connector port has an oblique angle with respect to sides of the PV laminate.

* * * * *